(12) United States Patent
Chen et al.

(10) Patent No.: US 7,986,179 B2
(45) Date of Patent: Jul. 26, 2011

(54) CIRCUIT AND METHOD FOR REDUCING POPPING SOUND

(75) Inventors: Chin Yang Chen, Keelung (TW); Jian Wen Chen, Hsingchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 12/483,490

(22) Filed: Jun. 12, 2009

(65) Prior Publication Data

US 2010/0315143 A1 Dec. 16, 2010

(51) Int. Cl.
*H03K 3/017* (2006.01)
(52) U.S. Cl. .................. 327/175; 327/172
(58) Field of Classification Search .............. None
See application file for complete search history.

(56) References Cited

U.S. PATENT DOCUMENTS

| 6,137,240 | A  | * | 10/2000 | Bogdan ............ 315/307 |
| 6,674,272 | B2 | * | 1/2004 | Hwang ............ 323/284 |
| 7,046,082 | B2 |   | 5/2006 | Komiya et al. |
| 7,138,841 | B1 | * | 11/2006 | Li et al. ............ 327/175 |
| 7,772,903 | B2 | * | 8/2010 | Jiang et al. ........ 327/172 |
| 2008/0143408 | A1 | * | 6/2008 | Paillet et al. ...... 327/175 |

* cited by examiner

*Primary Examiner* — Cassandra Cox
(74) *Attorney, Agent, or Firm* — WPAT, P.C.; Anthony King

(57) ABSTRACT

A circuit for reducing popping sound comprises a waveform generator, a voltage accumulator, and a comparator. The waveform generator is configured for generating a periodic waveform, and the voltage accumulator is configured for generating an increased voltage. The comparator is configured for comparing the periodic waveform with the increased voltage for generating a successive pulse signal. A percentage of a duty cycle in the successive pulse signal is increased gradually.

14 Claims, 10 Drawing Sheets

CIRCUIT AND METHOD FOR REDUCING POPPING SOUND

BACKGROUND OF THE INVENTION

1. Field of the Invention

The present invention relates to an integrated circuit, and more particularly to an integrated circuit operated for reducing a popping sound.

2. Description of the Related Art

Audio amplifier can be categorized as analog and digital classes. Analog audio output apparatus is controlled by an analog audio source, while a digital audio output apparatus is controlled by a pulse width modulated audio source. A digital audio output apparatus generally includes, as shown in FIG. 1, a high-side FET $M_1$, a low-side FET $M_2$, an LC low-pass filter 10, a capacitor $C_2$, and a speaker 12.

The high-side FET $M_1$ and the low-side FET $M_2$ are coupled in series between a positive power rail $V_{CC}$ and GROUND. The high-side FET $M_1$ and the low-side FET $M_2$ are controlled by a high-side PWM signal (PWMH) and a low-side PWM signal (PWML), respectively. Both PWMH and PWML signals have substantially the same pulse width but are opposite to each other in phase. The LC low-pass filter 10 consisting of inductor $L_1$ and capacitor $C_1$ is used to filter out the PWM switching noise, and the capacitor $C_2$ is used to filter out a direct current component.

It has been observed that a popping sound is often produced at the audio output of the speaker 12 during startup regardless of analog or digital audio output amplifier. The popping sound is offensive to the ears and may damage the speaker 12. FIG. 2 shows a block diagram of an electronic device having a sound output module disclosed in U.S. Pat. No. 7,046,082. Referring to FIG. 2, when an ON-OFF control signal Vpon has increased from a low level to a high level, a bias voltage Vb2 gradually increases according to a time constant determined by resistance values of resistors 21, 22 and a capacitance value of a capacitor 23. Since an output signal Vout of an output amplifier 26 increases in the same manner as does the bias voltage Vb2, a voltage Vx of a point X and a voltage Vy of a point Y also gradually increase. Consequently, since the voltage Vy changes gradually, the popping sound generated by a speaker Sp can be limited to a low level.

While the prior art solution to the problem of startup transients may be effective for analog applications, the circuit is only implemented in a pure analog circuit, and signals are transmitted in analog form. It is therefore desirable to provide a circuit and a method for generating PWM signals to reduce the popping sound at power-up or power-down for the digital audio amplifier as well.

SUMMARY OF THE INVENTION

An aspect of the present invention is to provide a circuit for reducing the popping sound.

According to one embodiment of the present invention, a circuit for reducing popping sounds comprises a waveform generator, a voltage accumulator, and a comparator. The waveform generator is configured for generating a periodic waveform, and the voltage accumulator is configured for generating an increased voltage. The comparator is configured for comparing the periodic waveform with the increased voltage for generating a successive pulse signal. A percentage of a duty cycle in the successive pulse signal is increased gradually.

Another aspect of the present invention is to provide a method for reducing the popping sound.

According to one embodiment of the present invention, a method for reducing popping sounds comprises the steps of receiving a periodic waveform, receiving an increased voltage; and comparing the periodic waveform with the increased voltage for generating a successive pulse signal. A percentage of a duty cycle in the successive pulse signal is increased gradually.

BRIEF DESCRIPTION OF THE DRAWINGS

The invention will be described according to the appended drawings in which.

DETAILED DESCRIPTION OF THE INVENTION

Figure 1:
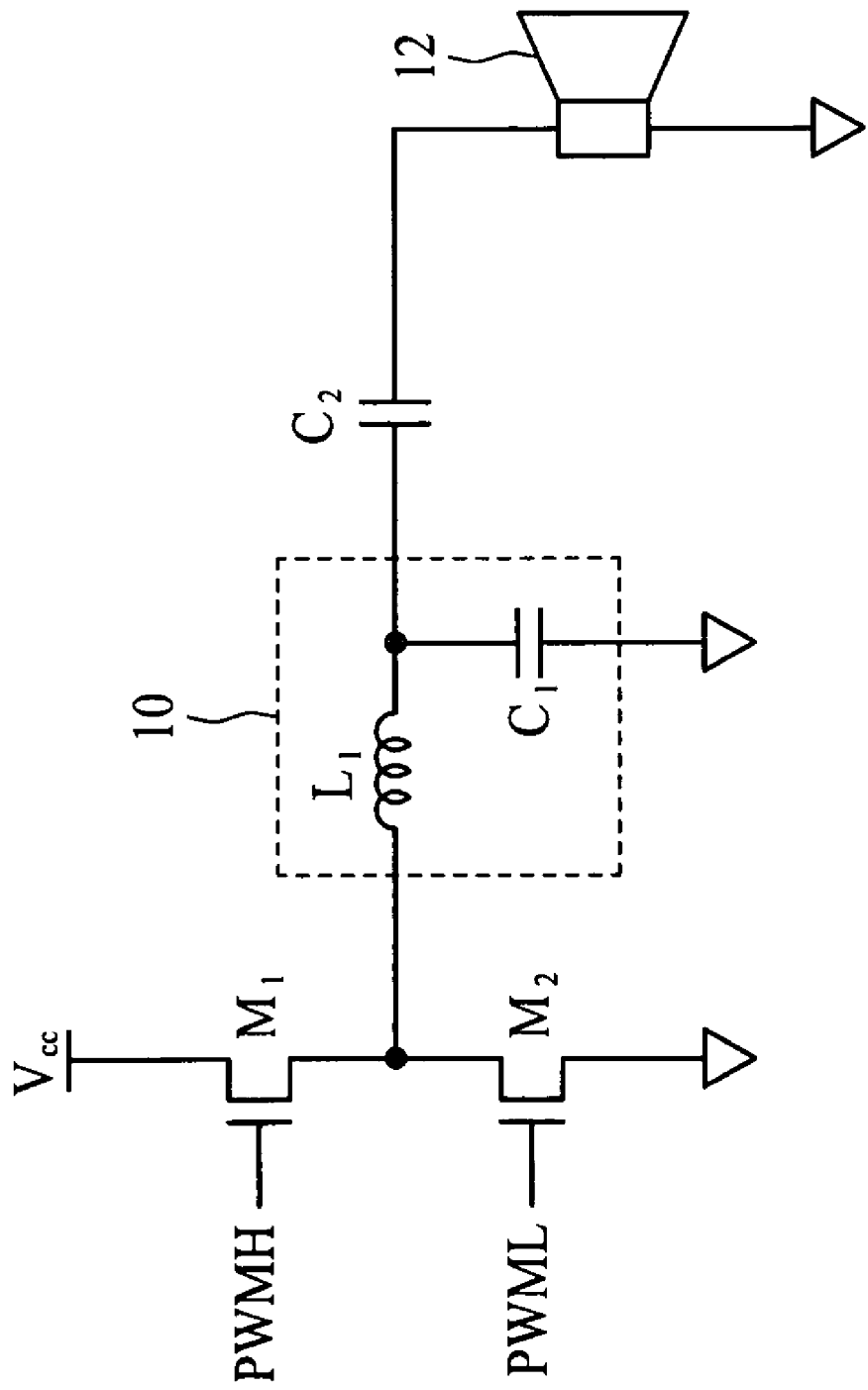
FIG. 1 shows an audio output apparatus.
Figure 2:
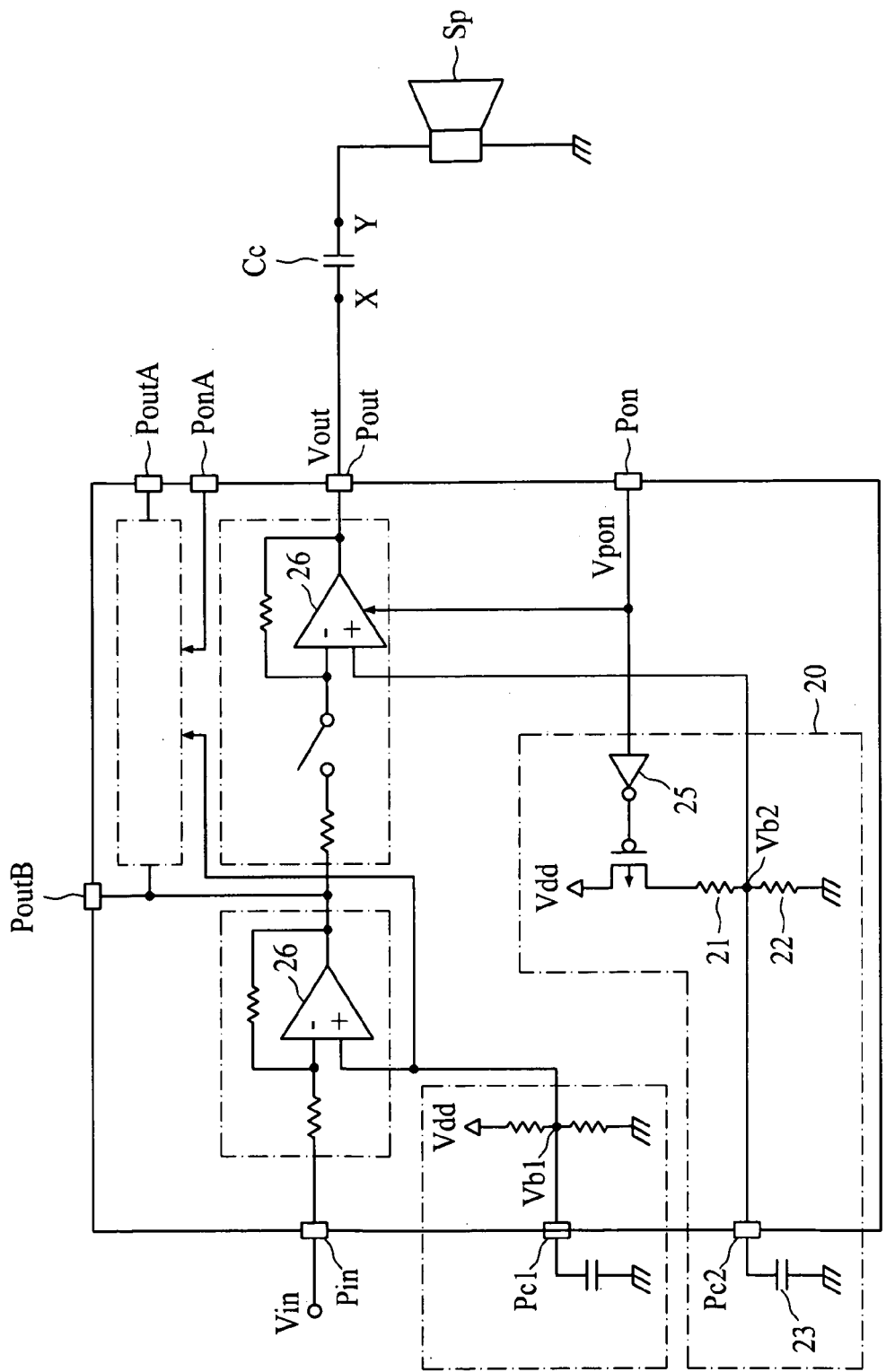
FIG. 2 shows a block diagram of an electronic device having a sound output module disclosed in U.S. Pat. No. 7,046,082.
Figure 3:
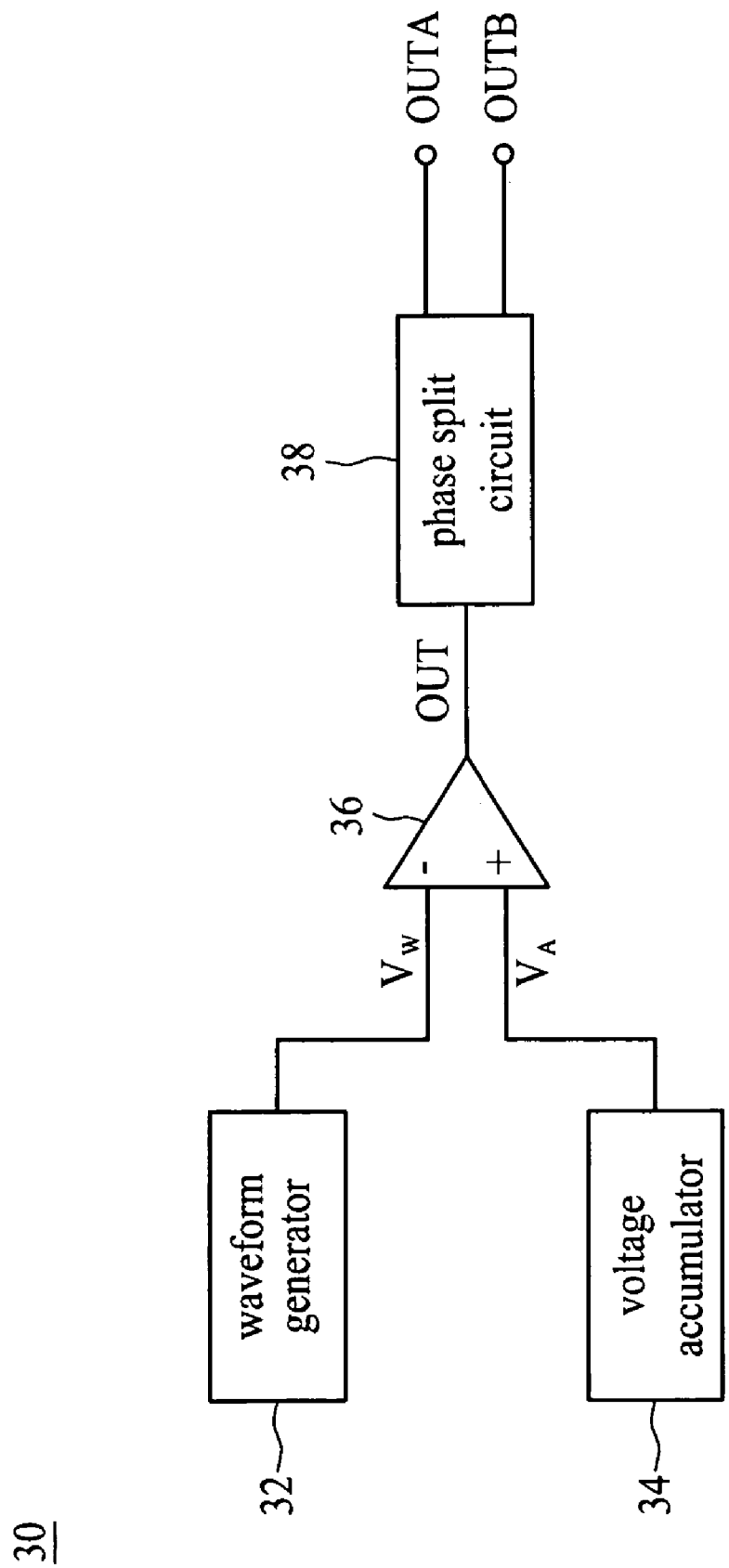
FIG. 3 shows a block diagram of a circuit for reducing popping sounds according to one embodiment of the present invention.

FIG. 3 shows a block diagram of a circuit 30 for reducing popping sounds according to one embodiment of the present invention. The circuit 30 comprises a waveform generator 32, a voltage accumulator 34, a comparator 36, and a phase split circuit 38. The waveform generator 32 is configured to produce a periodic waveform $V_W$, such as a triangle or sawtooth waveform. The voltage accumulator 34 is configured to generate an increased voltage $V_A$. The comparator 36 compares the periodic waveform $V_W$ with the increased voltage $V_A$ for generating an output signal OUT. Then, the output signal OUT is sent to the phase split circuit 38 for generating two separate output signals OUTA and OUTB. The two separate output signals OUTA and OUTB are transmitted alternatively.

Figure 4:
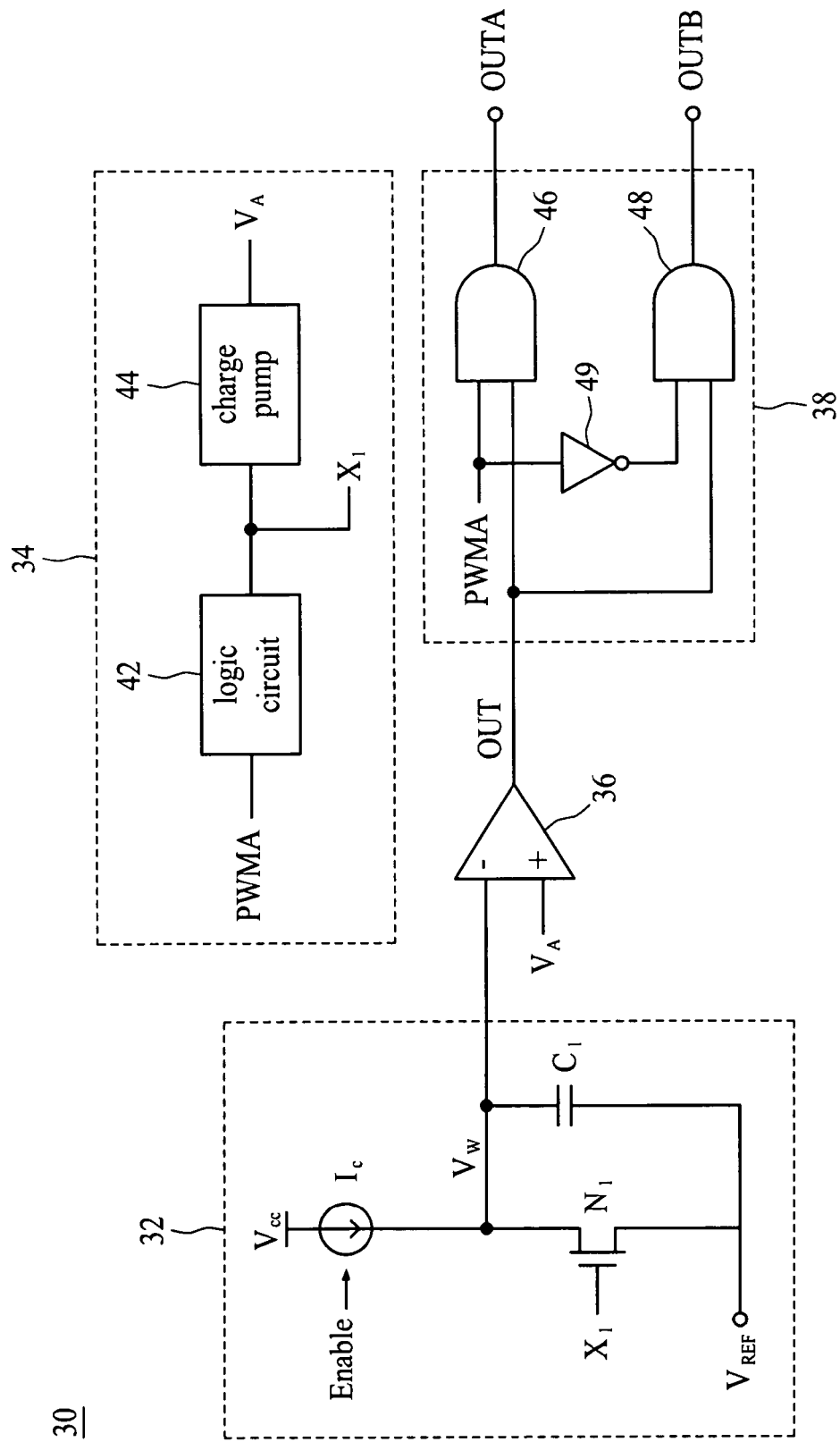
FIG. 4 shows a detailed block diagram in accordance with one embodiment of the circuit in FIG. 3.
Figure 5:
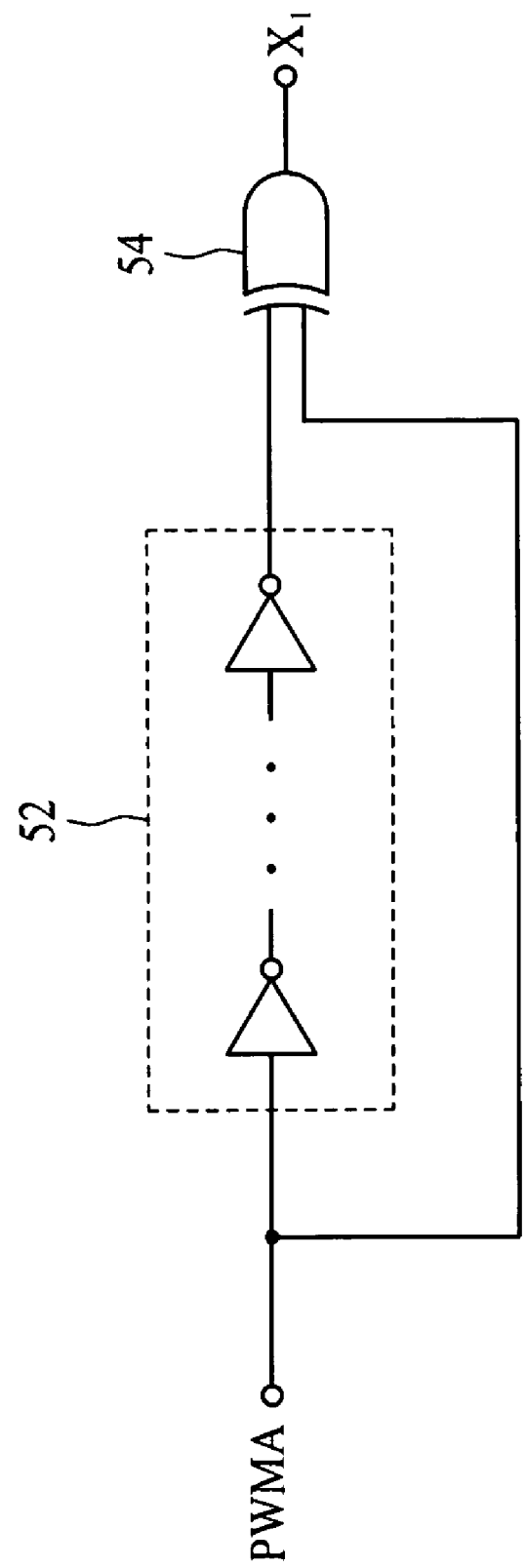
FIG. 5 shows a detailed block diagram in accordance with one embodiment of the logic circuit.

FIG. 4 shows a detailed block diagram in accordance with one embodiment of the circuit 30 in FIG. 3. Referring to FIG. 4, the voltage accumulator 34 comprises a logic circuit 42 and a charge pump 44. An output signal $X_1$ of the logic circuit 42 is a pulse signal synchronous with rising and falling edges of an input signal PWMA. When the pulse signal $X_1$ arrives at an input terminal of the charge pump 44, the charge pump 44 outputs the increased voltage $V_A$. FIG. 5 shows a detailed block diagram in accordance with one embodiment of the logic circuit 42. The logic circuit 42 comprises an inverter chain and an exclusive or (XOR) gate.

Figure 6:
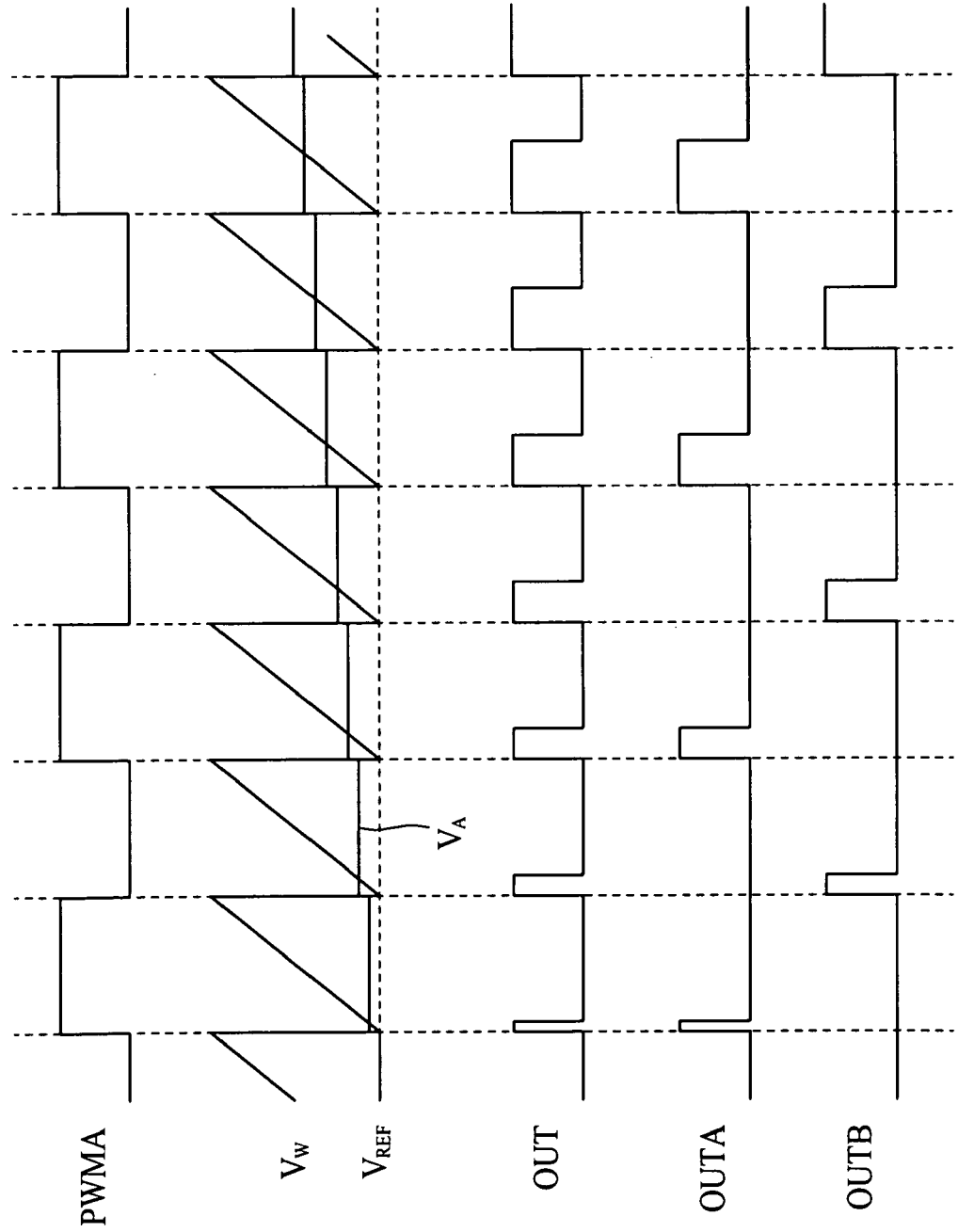
FIG. 6 shows operational waveforms of the circuit shown in FIG. 4.

Referring to FIG. 4, the waveform generator 32 comprises a constant current source $I_C$ controlled by a control signal Enable, an NMOS transistor $N_1$, and a capacitor $C_1$. The NMOS transistor $N_1$ has a gate configured to receive the output signal $X_1$ of the logic circuit 42, a drain connected to the constant current source $I_C$, and a source connected to a reference voltage $V_{REF}$. The capacitor $C_1$ is connected between the constant current source $I_C$ and the reference voltage $V_{REF}$. The capacitor $C_1$ is charged with the constant current $C_1$ and discharged when the pulse signal $X_1$ arrives at the gate of the NMOS transistor $N_1$. FIG. 6 shows operational waveforms of the circuit shown in FIG. 4. As shown in FIG. 6, the periodic waveform $V_W$ is represented as a sawtooth waveform.

Now referring to FIG. 4 and FIG. 6, when the periodic waveform $V_W$ is larger than the increased voltage $V_A$, the comparator 36 outputs a high digital signal. Next, the phase split circuit 38 generates the first output signal OUTA when the input signal PWMA goes high, and generates the second output signal OUTB when the input signal PWMA goes low. Since the voltage $V_A$ generated by the voltage accumulator 34 increases stepwise, the percentage of the duty cycle in each of the successive pulse signals OUT, OUTA, and OUTB is increased gradually until a nominal operating percentage of the duty cycle, for example 50% duty cycle, is reached. In such way, the popping sound is reduced when the speaker is driven by a single input signal, such as the pulse signal OUT, or driven by a differential input signal, such as the pulse signals OUTA and OUTB. The constant current source $I_C$ is deactivated for saving power when the duty cycle of the pulse signal OUT reaches the nominal operating percentage of the duty cycle.

Figure 7:
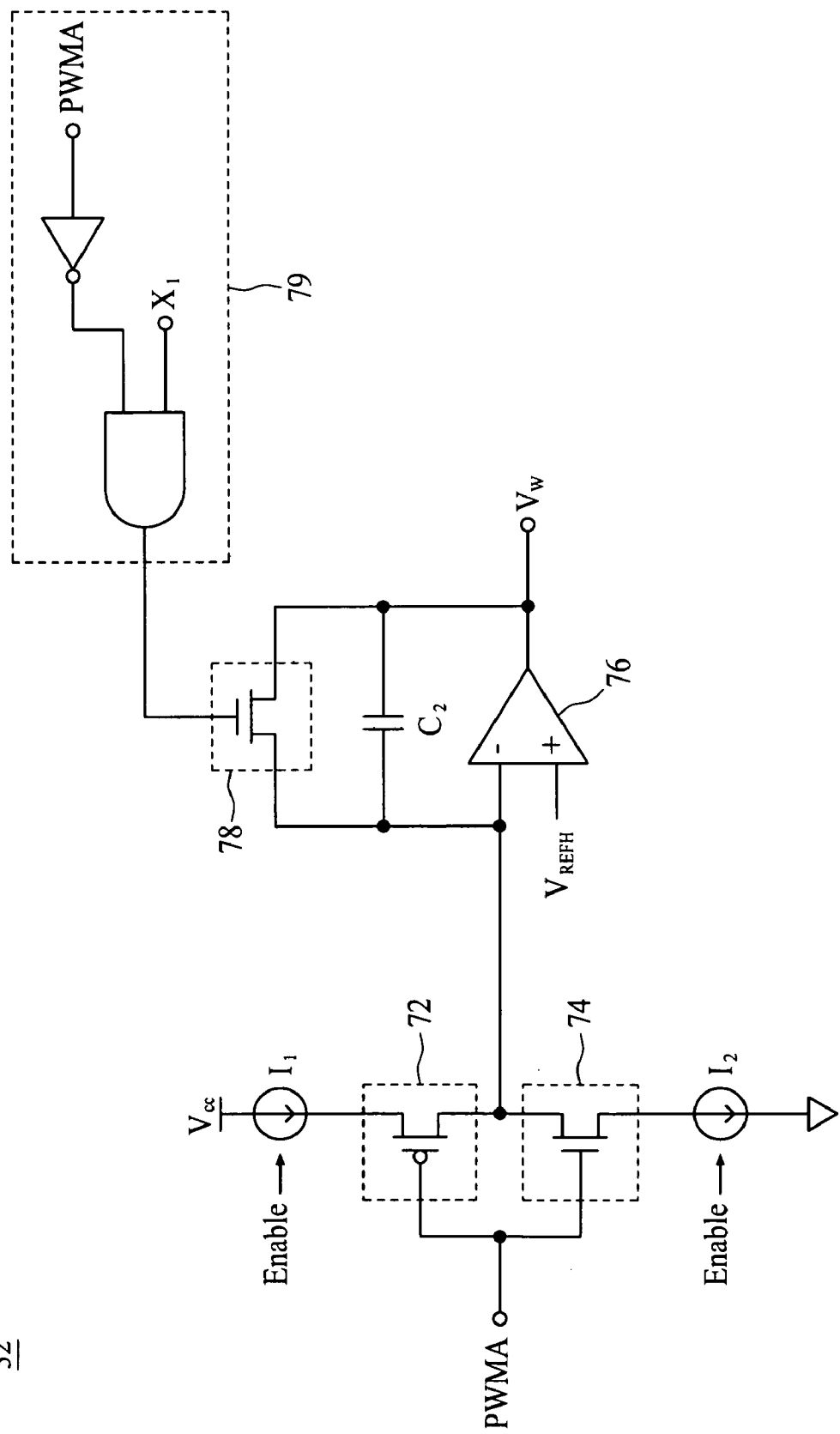
FIG. 7 shows a detailed block diagram in accordance with another embodiment of the waveform generator shown in FIG. 3.

FIG. 7 shows a detailed block diagram in accordance with another embodiment of the waveform generator 32 shown in FIG. 3. Referring to FIG. 7, the waveform generator 32 comprises a constant current source $I_1$, a switch 72 connected in series with the constant current source $I_1$, a constant current source $I_2$, a switch 74 connected in series with the constant current source $I_2$, an operational amplifier 76, a capacitor $C_2$, a switch 78, and a logic circuit 79. The constant current sources $I_1$ and $I_2$ are controlled by a control signal Enable. In this embodiment, the switch 72 is implemented as a PMOS transistor, whose gate is connected to the input signal PWMA, and the switch 74 is implemented as an NMOS transistor, whose gate is also connected to the input signal PWMA. The non-inverting input terminal of the operational amplifier 76 is connected to a reference voltage $V_{REFH}$, and the inverting input terminal of the operational amplifier 76 is connected to one terminal of the switch 72 and the capacitor $C_2$. The switch 78 is connected in parallel with the capacitor $C_2$, and an output terminal of the logic circuit 79 is connected to the switch 78 for discharging the capacitor 78.

Figure 8:
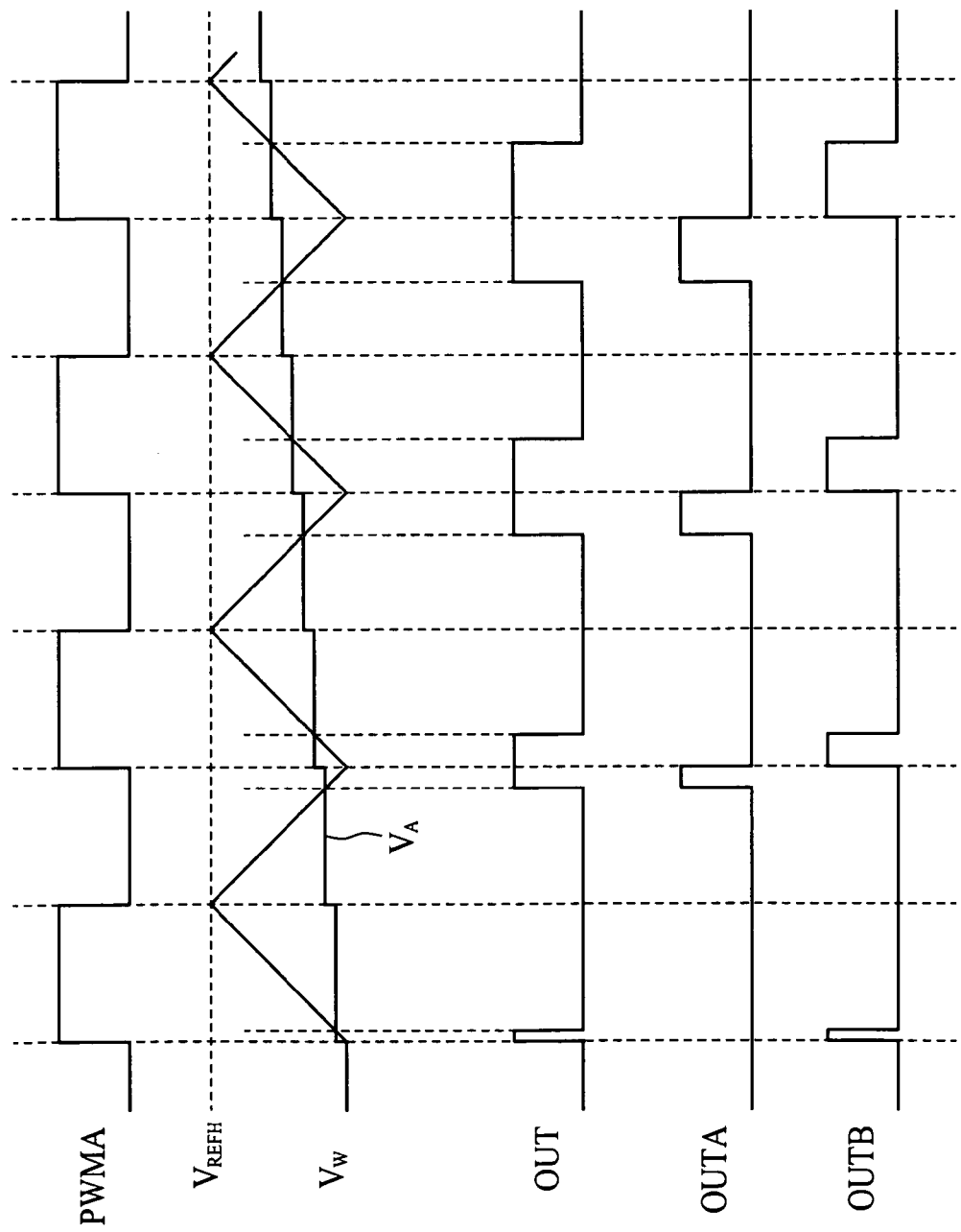
FIG. 8 shows operational waveforms of the circuit shown in FIG. 7.

FIG. 8 shows operational waveforms of the circuit shown in FIG. 7. Referring to FIG. 7 and FIG. 8, when the input signal PWMA goes low, the constant current source $I_1$ flows through the capacitor $C_2$ via the switch 72, and thus the output signal $V_W$ of the operational amplifier 76 reduces from the reference voltage $V_{REFH}$. Alternatively, when the input signal PWMA goes high, the constant current source $I_2$ flows through the capacitor $C_2$ via the switch 74, and thus the output signal $V_W$ of the operational amplifier 76 increases. The switch 78, implemented as an NMOS transistor in this embodiment, is turned on to reset the output signal $V_W$ of the operational amplifier 76 so as to avoid the mismatch between the constant current sources $I_1$ and $I_2$. In such way, the output signal $V_W$ of the operational amplifier 76 is generated as a triangular waveform. Additionally, the constant current sources $I_1$ and $I_2$ are deactivated for saving power when the duty cycle of the pulse signals OUTA and OUTA reach the nominal operating percentage of the duty cycle.

Figure 9:
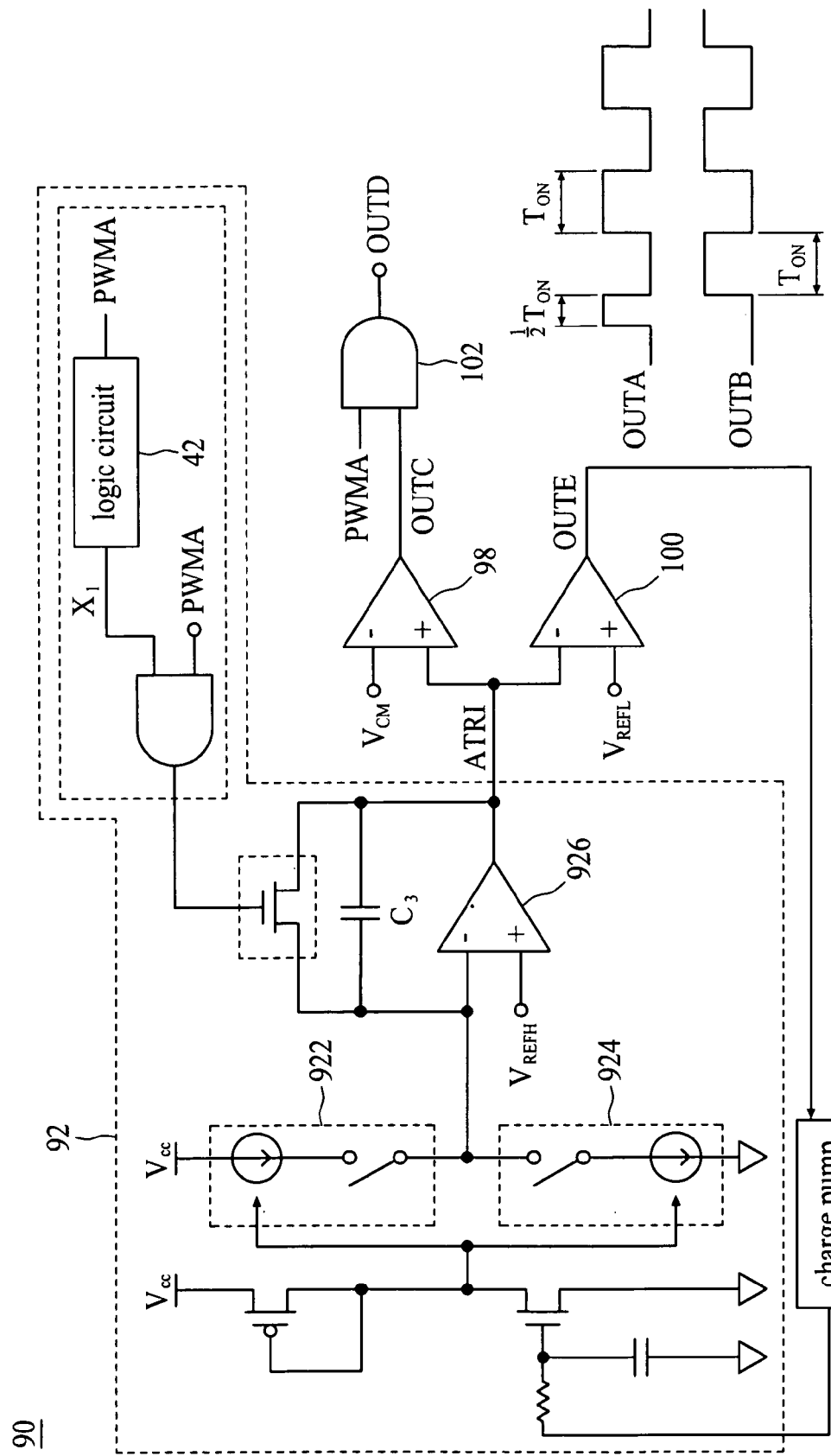
FIG. 9 shows a block diagram of a circuit for reducing popping sounds according to one embodiment of the present invention.

FIG. 9 shows a block diagram of a circuit 90 for reducing popping sounds according to one embodiment of the present invention. When the speaker is driven by a differential input signal, such as the pulse signals OUTA and OUTB shown in FIG. 3, the pulse width of the first pulse of the pulse signal OUTA should be equal to one half of the pulse width of the other pulses at 50% duty cycle. Referring to FIG. 9, the circuit 90 comprises a waveform generator 92, a charge pump 94, and two comparators 98 and 100. The waveform generator 92 comprises an operational amplifier 926, and two switched current sources 922 and 924, each of which is constituted by a bias current and a switch. The switched current source 922 flows through a capacitor $C_3$ to reduce the output voltage ATRI of the operational amplifier 926. The other switched current source 924 flows through the capacitor $C_3$ to increase the output voltage ATRI of the operational amplifier 926. In such way, the output voltage ATRI is a triangular waveform in this embodiment. In addition, the comparator 100 compares the output voltage ATRI with a reference voltage $V_{REFL}$ for generating an output signal OUTE, and the comparator 98 compares the output voltage ATRI with a reference voltage $V_{CM}$ for generating an output signal OUTC.

Figure 10:
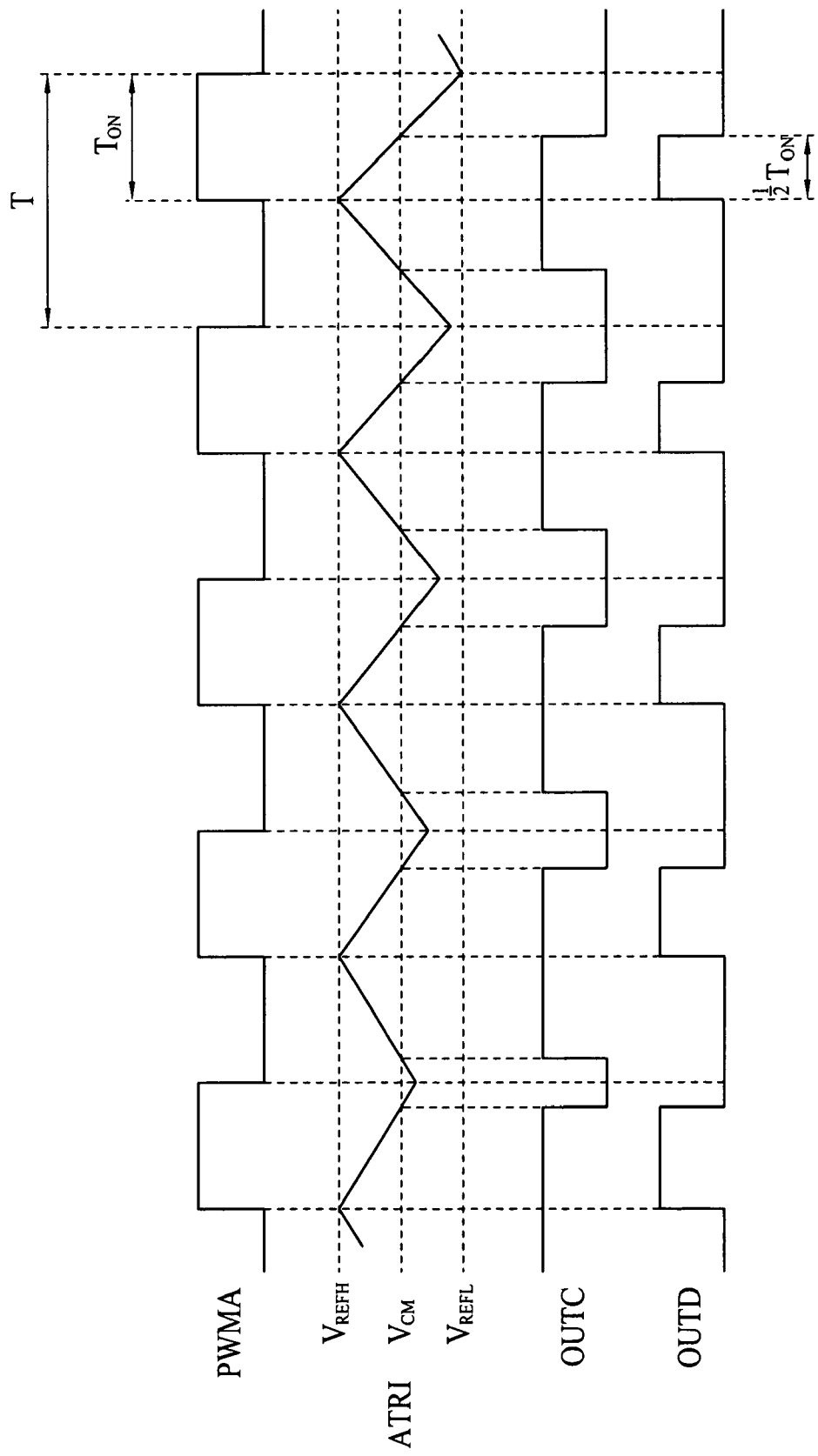
FIG. 10 shows operational waveforms of the circuit shown in FIG. 9.

FIG. 10 shows operational waveforms of the circuit shown in FIG. 9. In FIG. 10, the duty cycle of the pulse signal PWMA is equal to 0.5. Initially, a valley value of the output voltage ATRI cannot reach the reference voltage $V_{REFL}$, and thus the switched current source 922 increases current to pull down the output voltage ATRI via a feedback mechanism. When the circuit 90 is operated in a steady state, a peak value of the output voltage ATRI is substantially equal to the reference voltage $V_{REFH}$, and the valley value of the output voltage ATRI is substantially equal to the reference voltage $V_{REFL}$. Because the reference voltage $V_{CM}$ is a middle value between the reference voltages $V_{REFH}$ and $V_{REFL}$, the duty cycle of the output signal OUTC is equal to 0.5 when the circuit 90 is operated in the steady state. Therefore, after a NAND gate operation, the duty cycle of the output signal OUTD from a NAND gate 102 is equal to one half of the pulse width of the pulse signal PWMA, and it could be inserted into the first pulse of the pulse signals OUTA for reducing the popping sound.

The above-described embodiments of the present invention are intended to be illustrative only. Numerous alternative embodiments may be devised by those skilled in the art without departing from the scope of the following claims.

What is claimed is:

1. A circuit for reducing a popping sound, comprising:
   a waveform generator configured for generating a periodic waveform;
   a voltage accumulator configured for generating an increased voltage; and
   a comparator configured for comparing the periodic waveform with the increased voltage for generating a successive pulse signal;
   wherein a percentage of a duty cycle in the successive pulse signal is increased gradually;
   wherein the waveform generator is deactivated when the percentage of the duty cycle in the successive pulse signal reaches a predetermined percentage of the duty cycle.

2. The circuit of claim 1, wherein the voltage accumulator comprises:
   a first logic circuit configured for generating a first output signal; and
   a charge pump configured for receiving the first output signal and generating the increased output voltage.

3. The circuit of claim 1, wherein the periodic waveform is either a triangle or a sawtooth waveform.

4. The circuit of claim 2, wherein the waveform generator comprises:
a first constant current source;
an NMOS transistor having a gate connected for receiving the first output signal, a drain connected to the first constant current source, and a source connected to a first reference voltage; and
a first capacitor connected between the first constant current source and the first reference voltage.

5. The circuit of claim 1, wherein the waveform generator comprises:
a first switched current source;
a second switched current source connected in series with the first switched current source;
an operational amplifier whose non-inverting input terminal is connected to a second reference voltage, and whose inverting input terminal is connected to the first switched current source; and
a second capacitor connected between the inverting input terminal of the operational amplifier and an output terminal of the operational amplifier.

6. The circuit of claim 5, wherein the waveform generator further comprises:
a first switch connected in parallel with the second capacitor; and
a second logic circuit configured for generating a second output signal to turn on the first switch.

7. The circuit of claim 5, wherein the first switched current source comprises a second constant current source and a second switch, and the second switched current source comprises a third constant current source and a third switch.

8. The circuit of claim 1, further comprising a phase split circuit for receiving the successive pulse signal and generating two separate output signals.

9. The circuit of claim 8, wherein the two separate output signals are transmitted in interlaced form with each other, and percentages of duty cycles of the two separate output signals are increased gradually.

10. A method for reducing a popping sound, comprising the steps of:
receiving a periodic waveform;
receiving an increased voltage; and
comparing the periodic waveform with the increased voltage for generating a successive pulse signal;
wherein a percentage of a duty cycle in the successive pulse signal is increased gradually;
wherein the periodic waveform is deactivated when the percentage of the duty cycle in the successive pulse signal reaches a predetermined percentage of the duty cycle.

11. The method of claim 10, wherein the periodic waveform is either a triangle or a sawtooth waveform.

12. The method of claim 10, wherein the increased voltage is synchronous with each of the rising and falling edges of a pulse signal.

13. The method of claim 10, further comprising splitting the phase of the successive pulse signal into two phase shifted signals.

14. The method of claim 13, wherein the two phase shifted signals are transmitted in interlaced form with each other, and percentages of duty cycles of the two phase shifted signals are increased gradually.

* * * * *